United States Patent [19]
Tozun et al.

[11] Patent Number: 5,646,955
[45] Date of Patent: Jul. 8, 1997

[54] APPARATUS FOR MEASURING CYCLE TO CYCLE JITTER OF A DIGITAL SIGNAL AND METHOD THEREFOR

[75] Inventors: Orhan Tozun, Monte Sereno; Earl William McCune, Jr., Santa Clara, both of Calif.

[73] Assignee: International Microcircuits, Inc., Milpitas, Calif.

[21] Appl. No.: 251,104

[22] Filed: May 31, 1994

[51] Int. Cl.$^6$ .................. H04B 3/46; H04B 17/00; H04A 1/20

[52] U.S. Cl. .................. 375/224; 375/375; 327/335

[58] Field of Search .................. 375/224, 226, 375/371, 375, 374, 376; 327/102, 170, 171, 291, 335

[56] References Cited

U.S. PATENT DOCUMENTS 3,546,588 12/1970 Campbell, Jr. .................. 375/226
3,771,059 11/1973 Butler et al. .................. 375/226
4,819,080 4/1989 Cucchietti et al. .................. 375/226

OTHER PUBLICATIONS

David A. Bell, "Solid State Pulse Circuits" third edition, A Reston Book, pp. 50–56 1988.

Primary Examiner—Stephen Chin
Assistant Examiner—Don Vo
Attorney, Agent, or Firm—Harry M. Weiss; Jeffrey D. Moy; Harry M. Weiss & Associates, P.C.

[57] ABSTRACT

A discriminator provides an output signal having an amplitude proportional to the frequency of a measured signal. The output of the discriminator is connected to a differentiator circuit that provides an impulse signal proportional to a cycle to cycle frequency change of the measured signal.

10 Claims, 1 Drawing Sheet

APPARATUS FOR MEASURING CYCLE TO CYCLE JITTER OF A DIGITAL SIGNAL AND METHOD THEREFOR

BACKGROUND OF THE INVENTION

1. Field of Invention

This invention is in the general field of apparatus for measuring frequency stability of electrical signals and methods therefor and, more particularly, is an apparatus for measuring cycle to cycle jitter of a digital signal and method therefor.

2. Description of the Prior Art

A phase locked loop (PLL) is a device where a digital PLL reference signal is applied to one of two inputs of a phase detector. An output signal from a voltage controlled oscillator (VCO) of the PLL is applied to the other input of the phase detector.

The output of the VCO is a digital signal having a frequency directly related to the amplitude of an applied input voltage. The phase detector output is a signal having an amplitude proportional to the difference between the phase of the PLL reference signal and the phase of the VCO output signal.

The phase detector output usually drives an amplifier that has its output connected to the input of the VCO. Accordingly, the PLL is a feedback device where the frequency of the VCO output signal equals the frequency of the PLL reference signal. Moreover, when the frequencies are equal, the PLL is said to be locked.

It should be understood that the stability of the PLL is directly related to the phase stability of the PLL reference signal. When the phase of the PLL reference signal varies rapidly, for example, the PLL may break lock and become unstable. A system, wherein the PLL is included as a component, may fail when the PLL breaks lock.

Accordingly, it is desirable to be able to specify aspects of the PLL reference signal that effect the performance of the PLL. Additionally, it is desirable to be able to measure these aspects of the PLL reference signal.

SUMMARY OF THE INVENTION

An object of the present invention is to provide apparatus for specifying aspects of a PLL reference signal that effect the performance of the PLL and method therefor.

Another object of the present invention is to provide apparatus for measuring aspects of a PLL reference signal that effects the performance of the PLL and method therefor.

Another object of the present invention is to provide apparatus for measuring cycle to cycle jitter of a digital signal and method therefor.

BRIEF DESCRIPTION OF THE PREFERRED EMBODIMENT

According to the present invention, the output signal of a discriminator has an amplitude proportional to the frequency of a measured signal. A frequency change of the measured signal is proportional to the first derivative of the amplitude of the discriminator output signal with respect to time.

The present invention provides a simple method for measuring cycle to cycle jitter of a digital signal. The invention is of particular utility in measuring the cycle to cycle frequency stability of a PLL reference signal.

Other features and advantages of the present invention will be apparent from the following description of the preferred embodiment thereof as illustrated in the accompanying drawing.

DESCRIPTION OF THE PREFERRED EMBODIMENT

A PLL is an example of a feedback device where the phase of an output signal is a physical variable that is being controlled. More particularly, the phase of the output signal is compared with the phase of a PLL reference signal in a phase detector.

The phase detector provides a detected signal that has an amplitude proportional to the difference between the phases of the compared signals. A change in the amplitude of the detected signal causes a phase change of the output signal that tends to maintain a constant difference between the phases.

It should be understood that the PLL reference signal waveform is a squarewave. Therefore, the phase of the PLL reference signal is determined at an edge of the PLL reference signal waveform. It is a transient change in phase of the PLL reference signal that causes cycle to cycle jitter whereby one cycle of the PLL reference signal is at a frequency that is different from the frequency of a preceding or succeeding cycle. The cycle to cycle jitter can cause the PLL to break lock.

Accordingly, frequency and phase changes of a signal, such as the PLL reference signal, are of critical importance. Because of the critical importance, the subject matter of this embodiment deals with a measured signal having a squarewave waveform.

Figure 2:
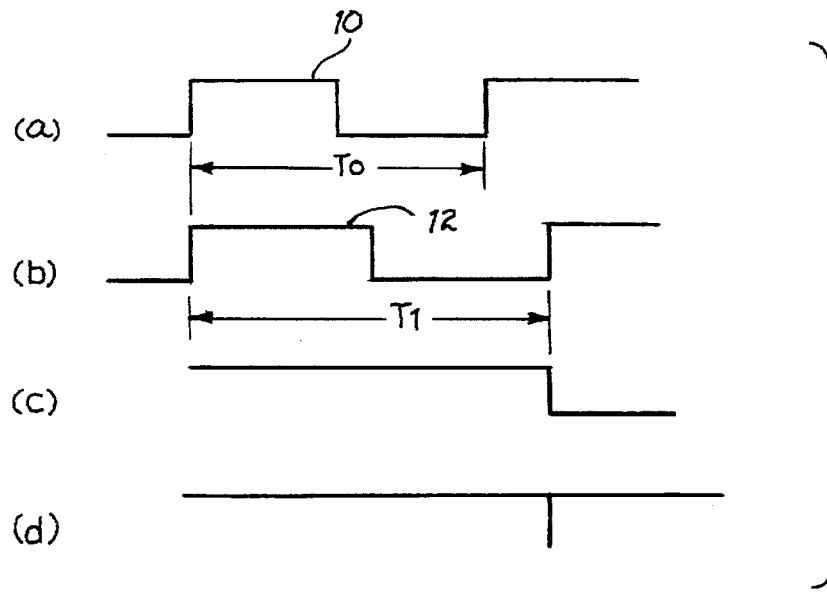
FIG. 2 is a showing of waveforms of signals in the embodiment of FIG. 1, that are provided in response to a cycle to cycle decrease in the frequency of a measured signal.

As shown in FIG. 2(a), a first cycle 10 of the measured signal waveform has a period of $T_0$. As shown in FIG. 2(b), cycle 10 is succeeded by a second cycle 12 that has a period of $T_1$ where $T_1 > T_0$. Since $T_1 > T_0$, the frequency of the measured signal during cycle 12 is less than the frequency of the measured signal during cycle 10.

Figure 1:
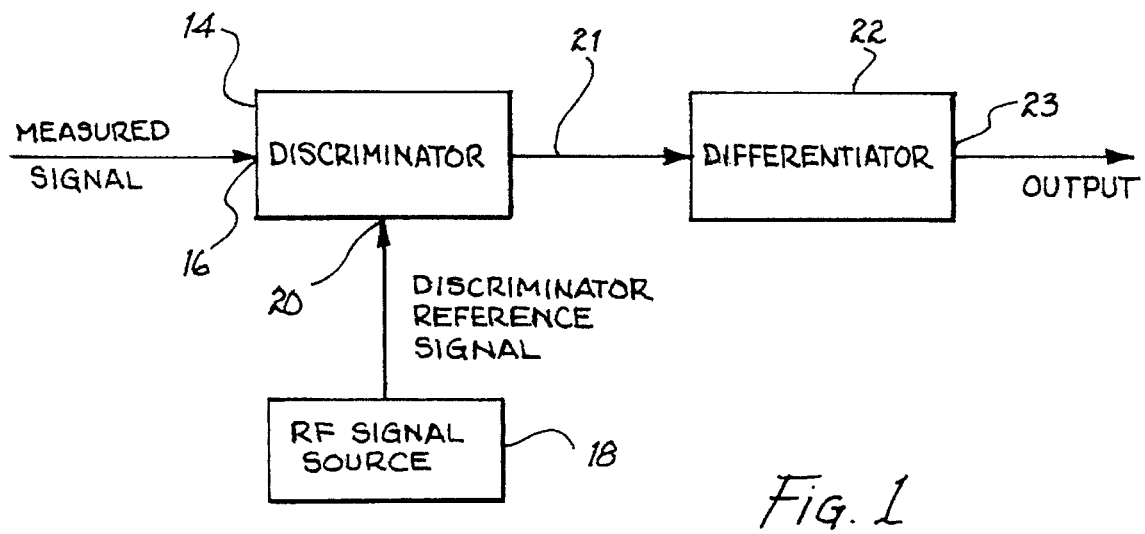
FIG. 1 is a block diagram of the preferred embodiment of the present invention.

As shown in FIG. 1, the measured signal is applied to a discriminator 14 at a signal input 16 thereof. Additionally, a reference signal source 18 is connected to a reference input 20 of discriminator 14. Discriminators are well known to those skilled in the art.

In this embodiment, the measured signal and the discriminator reference signal have the same nominal frequency. However, the discriminator reference signal is substantially frequency invariant. The measured signal is not frequency invariant.

Discriminator 14 provides a discriminator voltage at its output that has an amplitude proportional to the difference between the frequency of the discriminator reference signal and the frequency of the measured signal. FIG. 2(c) is a waveform of the discriminator voltage. As shown in FIG. 2(c), because the frequency of the measured signal during cycle 12 is less than the frequency of the measured signal during cycle 10, there is a negative step change in the discriminator voltage.

The output of discriminator 14 (FIG. 1) is connected through a signal line 21 to a differentiator circuit 22 at its input. Differentiator 22 provides a voltage at an output 23 thereof proportional to the derivative of the amplitude of an applied voltage with respect to time. Differentiator circuits are well known to those skilled in the art.

FIG. 2(d) is a waveform of the voltage provided at output 23. As shown in FIG. 2(d), differentiator 22 provides a negative impulse signal in response to the negative step change. Moreover, the amplitude of the negative impulse signal is proportional to the difference between the frequency of the measured signal during cycle 12 and the frequency of the measured signal during cycle 10.

Figure 3:
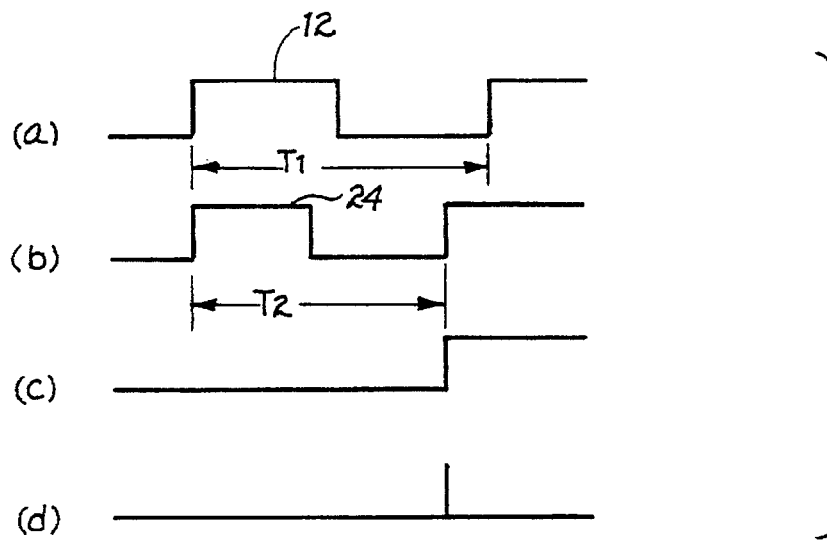
FIG. 3 is a showing of waveforms of signals in the embodiment of FIG. 1, that are provided in response to a cycle to cycle increase in the frequency of a measured signal.

As shown in FIGS. 3(a) and 3(b), cycle 12 is succeeded by a cycle 24 (FIG. 3(b)) that has a period of $T_2$ where $T_2 < T_1$. Since $T_2 < T_1$, the frequency of the measured signal during cycle 24 is greater than the frequency of the measured signal during cycle 12.

As shown in FIG. 3(c), because the frequency of the measured signal during cycle 24 is greater than the frequency of the measured signal during cycle 12, there is a positive step change in the discriminator voltage. As shown in FIG. 3(d), a positive impulse signal is provided at output 23 in response to the positive step change. The amplitude of the positive impulse signal is proportional to the difference between the frequency of the measured signal during cycle 24 and the frequency of the measured signal during cycle 12.

While the invention has been particularly shown and described with reference to a preferred embodiment thereof, it should be understood by those skilled in the art that changes in form and detail may be made therein without departing from the spirit and scope of the invention.

I claim:

1. Apparatus for measuring cycle to cycle jitter of a measured signal comprising, in combination:

source means for providing said measured signal;

reference signal source means for providing a reference signal;

discriminator means having an input coupled to said source means and an input coupled to said reference signal source means for providing a discriminator voltage having an amplitude proportional to a difference between a frequency of said reference signal and a frequency of said measured signal; and differentiator means coupled to an output of said discriminator means for providing a voltage substantially proportional to a derivative of an amplitude of said discriminator voltage with respect to time.

2. The apparatus of claim 1 wherein said frequency of said measured signal is a nominal frequency.

3. The apparatus of claim 1 wherein said reference signal is a square waveform.

4. The apparatus of claim 2 wherein said reference signal is a square waveform at said nominal frequency.

5. The apparatus of claim 1 wherein said differentiator means for providing a voltage substantially proportional to a derivative of an amplitude of said discriminator voltage with respect to time is a differentiator circuit.

6. The apparatus of claim 5 wherein said differentiator circuit having means for providing a negative impulse signal in response to a negative step change in said discriminator voltage and having an amplitude proportional to a difference between a frequency of said measured signal during a second cycle and a frequency of said measured signal during a first cycle.

7. The apparatus of claim 5 wherein said differentiator circuit having means for providing a positive impulse signal in response to a positive step change in said discriminator voltage and having an amplitude proportional to a difference between a frequency of said measured signal during a second cycle and a frequency of said measured signal during a first cycle.

8. A method for measuring cycle to cycle jitter of a measured signal having a square waveform comprising the steps of:

providing a measured signal;

providing a reference signal having a square waveform;

providing a discriminator voltage having an amplitude proportional to a difference between a frequency of said reference signal and a frequency of said measured signal; and providing a derivative voltage substantially proportional to the derivative of an amplitude of said discriminator voltage with respect to time.

9. The method of claim 8 wherein said step of providing a derivative voltage further comprises the step of providing a negative impulse signal in response to a negative step change in said discriminator voltage and having an amplitude proportional to a difference between a frequency of said measured signal during a second cycle and a frequency of said measured signal during a first cycle.

10. The method of claim 8 wherein said step of providing a derivative voltage further comprises the step of providing a positive impulse signal in response to a positive step change in said discriminator voltage and having an amplitude proportional to a difference between a frequency of said measured signal during a second cycle and a frequency of said measured signal during a first cycle.

* * * * *